(12) United States Patent
Sarma

(10) Patent No.: US 8,269,212 B2
(45) Date of Patent: Sep. 18, 2012

(54) OLED DISPLAY WITH A COMMON ANODE AND METHOD FOR FORMING THE SAME

(75) Inventor: Kalluri R. Sarma, Mesa, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/432,402

(22) Filed: Apr. 29, 2009

(65) Prior Publication Data

US 2010/0276671 A1    Nov. 4, 2010

(51) Int. Cl.
*H01L 29/08*    (2006.01)
*H01L 51/40*    (2006.01)

(52) U.S. Cl. ....... 257/40; 257/72; 257/98; 257/E51.022; 438/29; 438/99; 438/149

(58) Field of Classification Search ............... 257/40, 257/72, 98, E51.022; 438/29, 99, 149, 158, 438/159
See application file for complete search history.

(56) References Cited

U.S. PATENT DOCUMENTS

| | | | |
|---|---|---|---|
| 6,272,645 B1* | 8/2001 | Wang | 713/323 |
| 2006/0208973 A1* | 9/2006 | Lee et al. | 345/76 |
| 2007/0194307 A1* | 8/2007 | Kim et al. | 257/40 |

* cited by examiner

*Primary Examiner* — Jerome Jackson, Jr.
*Assistant Examiner* — Jose R Diaz
(74) *Attorney, Agent, or Firm* — Ingrassia Fisher & Lorenz, P.C.

(57) ABSTRACT

A pixel for an organic light emitting diode (OLED) display and a method for forming such a pixel is provided. The pixel includes a substrate, a transistor formed over the substrate, and an OLED formed over the substrate. The transistor includes a gate, a source, and a drain. The OLED includes an anode, an emissive layer formed over the anode, and a cathode formed over the emissive layer. The cathode is electrically connected to the drain of the transistor.

20 Claims, 5 Drawing Sheets

OLED DISPLAY WITH A COMMON ANODE AND METHOD FOR FORMING THE SAME

TECHNICAL FIELD

The present invention generally relates to organic light emitting diode (OLED) display devices, and more particularly relates to an OLED display device with a common anode and a method for forming the display device.

BACKGROUND

In recent years, flat panel display devices, such as liquid crystal displays (LCDs) and organic light emitting diode (OLED) displays are becoming increasingly popular as mechanisms for displaying information to operators of vehicles, such as aircraft. One of the reasons for this is that such displays are capable of providing very bright and clear images that are easily seen by the user in a broad range of environmental conditions, such as operating temperatures and ambient lighting conditions.

Active matrix (AM) OLED displays offer significant advantages over current AM LCD displays with respect to image quality and viewing angle. Additionally, AM OLED displays offer a faster response time, and are lighter, thinner, less expensive (i.e., no need for a backlight or color filters), and consume less power. However, there are technical issues associated with AM OLEDs that need to be resolved before the full potential of the technology is realized.

Currently, low-temperature poly-silicon (LTPS) thin film transistor (TFT) technology is typically used with AM OLEDs. While LTPS TFTs are appropriate for use in small, high resolution displays for mobile applications, it is considerably more expensive to produce large area displays, particularly compared to amorphous silicon (a-Si) TFT technology, which is generally used in large area, flat panel AM LCDs.

However, a-Si TFTs operate only in the n-channel mode. The OLED is typically on the source side of the TFT and has a common cathode architecture. Thus, any variations in the OLED device (i.e., the pixel) result in variations in the gate potential of the drive TFT, which in turn results non-uniform pixel luminance. An n-channel transistor, with the OLED on the drain side of the pixel circuit with a common anode architecture is ideally suited for driving AM OLED pixels. However, in the past, it has not been possible to fabricate AM OLED displays with a common anode architecture because of the difficulty in depositing the indium tin oxide (ITO)) anode layer on top of the organic layers of the OLED device stack. For example, deposition of an ITO anode layer onto the organic layers damages the organic layers due to exposure to oxygen during sputter deposition process.

Additionally, because of the low mobility of a-Si TFTs, the drive circuitry occupies significant surface area on the pixel, thereby reducing the pixel aperture ratio, and thus the average pixel luminance. As a result, the pixels are often operated at undesirably high voltage and power levels in order to achieve the required average pixel luminance, which reduces the useful life of the pixels.

Accordingly, it is desirable to provide a method and system for addressing these issues associated with the use of a-Si TFTs in OLED displays. Furthermore, other desirable features and characteristics of the present invention will become apparent from the subsequent detailed description of the invention and the appended claims, taken in conjunction with the accompanying drawings and this background of the invention.

BRIEF SUMMARY

A pixel for an organic light emitting diode (OLED) display is provided. The pixel includes a substrate, an n-channel transistor formed over the substrate, and an OLED formed over the substrate. The n-channel transistor includes a gate, a source, and a drain. The OLED includes an anode, an emissive layer formed over the anode, and a cathode formed over the emissive layer. The cathode is electrically connected to the drain of the n-channel transistor.

A thin film transistor (TFT) OLED display device is provided. The TFT OLED display device includes at least one substrate, a plurality of TFTs formed on the at least one substrate, and a plurality of OLEDs formed on the at least one substrate. Each of the plurality of TFTs includes a gate, a source, and a drain. Each of the plurality of OLEDs includes an anode, an emissive layer formed over the anode, and a semi-transparent cathode formed over the emissive layer. The anodes of the plurality of OLEDs are electrically interconnected to jointly form a common anode.

A method for forming pixels of a thin film transistor (TFT) organic light emitting diode (OLED) display is provided. A plurality of n-channel TFTs are formed on a substrate. Each of the plurality of n-channel TFTs includes a gate, a source, and a drain. An insulating layer is formed on the substrate and at least partially over the drains of at least some of the plurality of the n-channel TFTs. A plurality of OLEDs are formed on the substrate. The forming of each of the plurality of OLEDs includes forming an anode over the insulating layer such that the anode is insulated from the drain of a respective one of the plurality of n-channel TFTs, forming an emissive layer over the anode, and forming a semi-transparent cathode over the emissive layer. The anodes of the plurality of OLEDs are electrically interconnected to jointly form a common anode.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, and brief summary or the following detailed description. It should also be noted that FIGS. 1-5 are merely illustrative and may not be drawn to scale.

FIG. 1 to FIG. 4 illustrate a pixel for an organic light emitting diode (OLED) display and a method for forming such a pixel. The pixel includes a substrate, a transistor formed over the substrate, and an OLED formed over the substrate. The transistor includes a gate, a source, and a drain. The OLED includes an anode, an emissive layer formed over the anode, and a cathode formed over the emissive layer. The cathode is electrically connected to the drain of the transistor. The anode of the OLED is, in one embodiment, electrically insulated from the drain of the transistor by an insulating body, and is a common, or global, anode.

Figure 1:
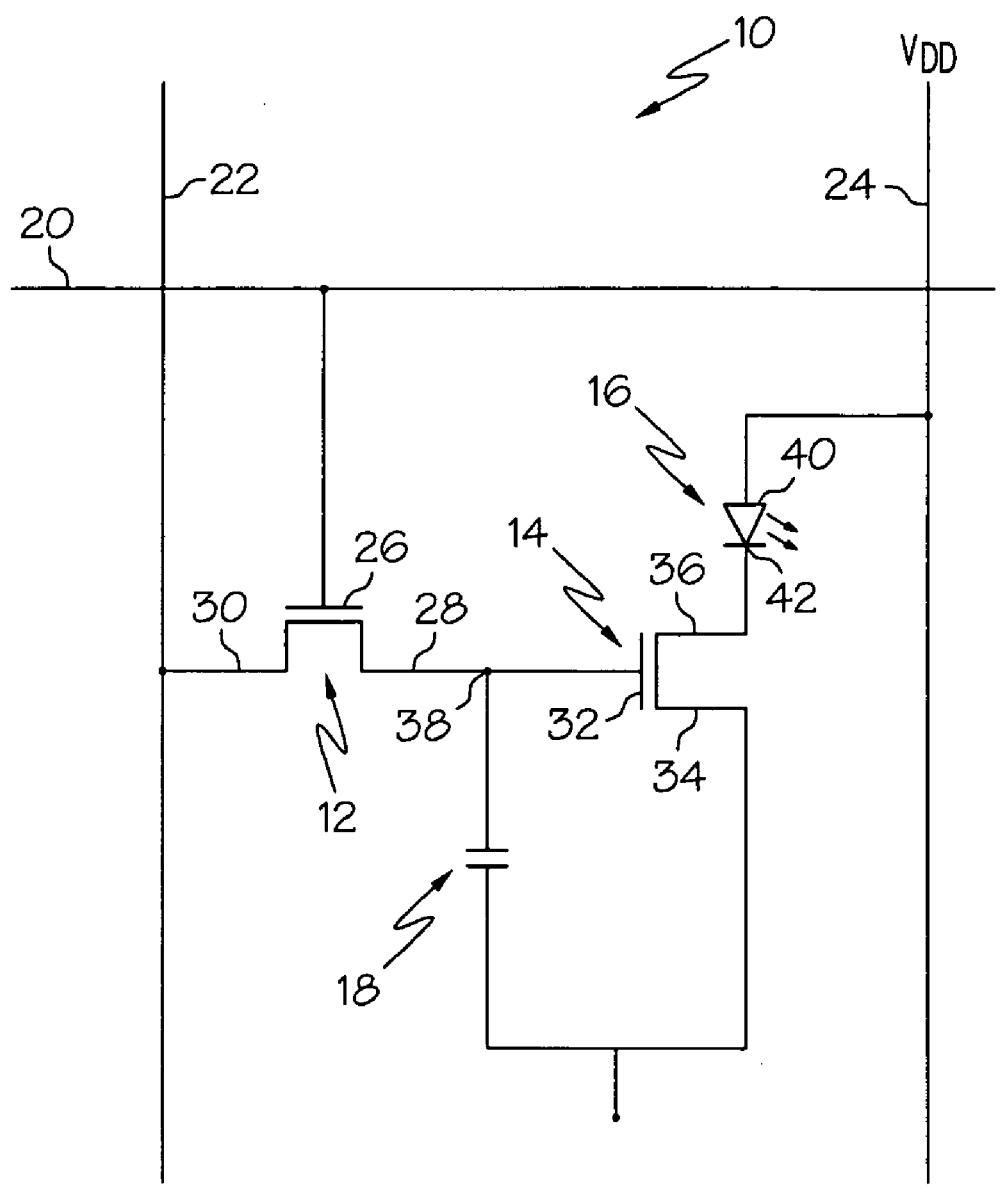
FIG. 1 is a schematic view of an active matrix (AM) organic light emitting diode (OLED) pixel circuit, according to one embodiment of the present invention.

FIG. 1 schematically illustrates a thin film transistor (TFT) active matrix (AM) organic light emitting diode (OLED) pixel (or pixel circuit) 10, according to one embodiment of the present invention. The pixel 10 includes a scan (or first) transistor 12, a drive (or second) transistor 14, an OLED 16, a storage capacitor 18, a gate bus line (or conductor) 20, a data bus line 22, and a power supply bus line ($V_{DD}$) 24. The scan transistor 12, as is commonly understood, includes a gate (or gate terminal) 26, a source (or source terminal) 28, and a drain (or drain terminal) 30. The drive transistor 14 similarly includes a gate 32, a source 34, and drain 36.

As shown, the gate 26 of the scan transistor 12 is electrically connected (or coupled) to the gate bus line 20, the drain 30 of the scan transistor 12 is electrically connected to the data bus line 22, and the source 28 of the scan transistor 12 is electrically connected to the gate 32 of the drive transistor 14 and the storage capacitor 18 through a storage node 38. The source 34 of the drive transistor 14 is electrically grounded (or connected to a ground terminal), and the drain 36 of the drive transistor 14 is electrically connected to the OLED 16. In one embodiment, the scan transistor 12 and the drive transistor 14 are n-channel thin film transistors (TFTs), as is commonly understood. Although the storage capacitor 18 is shown schematically as a separate component, the storage capacitor 18 may be formed by the source 28 of the scan transistor 12 (i.e., a first electrode of the storage capacitor 18) and the source 34 of the drive transistor 14 (i.e., a second electrode of the storage capacitor 18), with an insulating layer, such as silicon dioxide ($SiO_2$) or silicon nitride ($SiN_x$), between the two electrodes as described below.

The OLED 16 includes, in part, an anode 40 and a cathode 42. In accordance with one aspect of the present invention, the OLED 16 is electrically connected to the drain 36 of the drive transistor 14. In particular, the cathode 42 of the OLED 16 is electrically connected to the drain 36 of the drive transistor 14, and the anode 40 of the OLED 16 is electrically connected to the power supply bus line 24.

Figure 2:
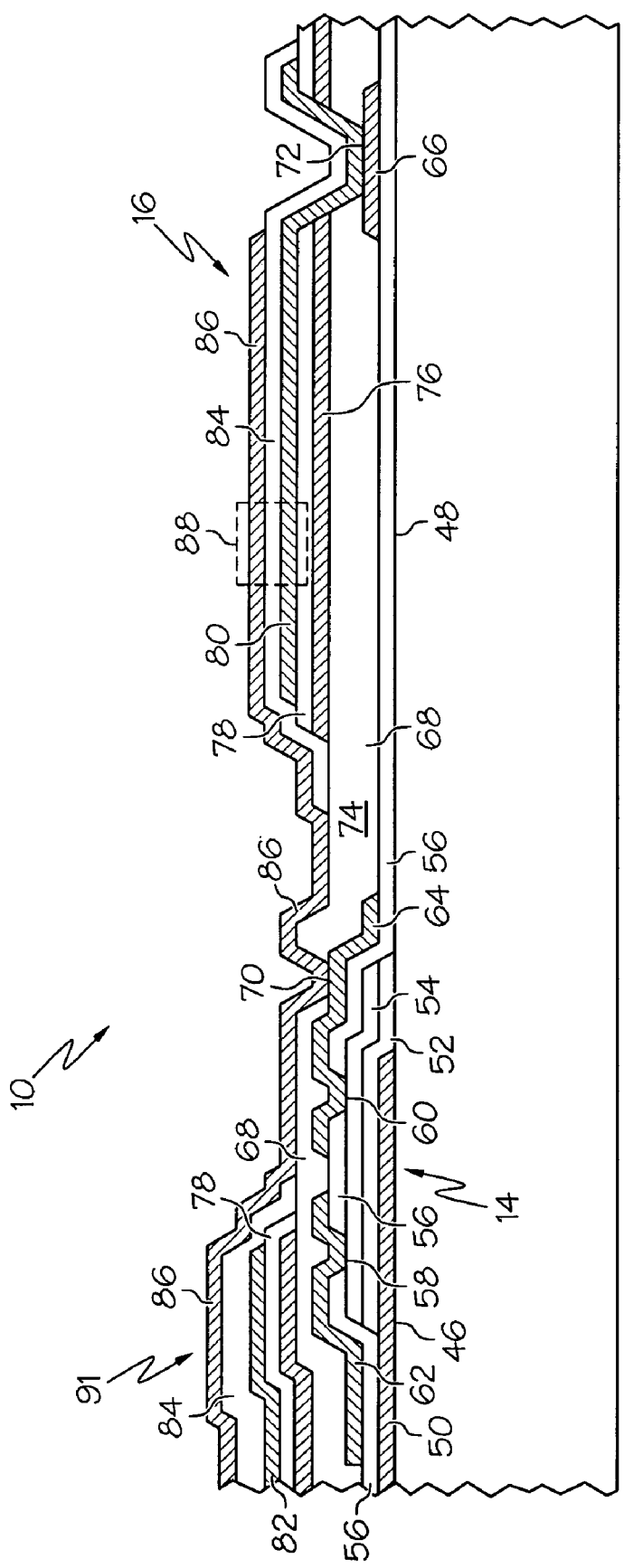
FIG. 2 is a cross-sectional side view of a substrate having a drive transistor and an OLED region of the AM OLED pixel of FIG. 1 formed thereon.

FIG. 2 illustrates a portion of a substrate 44 on which the pixel 10 of FIG. 1 may be formed, according to one embodiment of the present invention. In one embodiment, the substrate 44 is a top emission amorphous silicon (a-Si) TFT AM OLED display with a common, or global, anode architecture. As will be appreciated by one skilled in the art, the pixel 10 may be formed on the substrate 44 using conventional processing techniques for forming OLED displays, including the forming and etching of various layers of materials, which is often facilitated using the deposition, exposure, and removal of multiple photoresist layers (not shown). It should be understood that although only a portion of the substrate 44 is shown in FIG. 2, the processes described below may be performed on the entire substrate simultaneously to form an array of transistors and OLEDs (including various colors of OLEDS), as is commonly understood.

According to one aspect of the present invention, a common anode is formed using conventional methods prior to the OLED stack deposition. The organic layers of the OLED stack are then deposited by conventional methods such as by shadow mask deposition or ink-jet printing. In case of shadow mask deposition of the organic layers, in addition to pixelating the required organic layers, the shadow mask protects the drain contact of the drive TFT for subsequent connection to the cathode electrode at the pixel, during the organic layer deposition. The transparent cathode electrode is then deposited on top of the OLED layers using an appropriate shadow mask. The cathode contacts the drain electrode of the drive TFT as shown in FIG. 2.

Referring again to FIG. 2, the substrate 44, in one embodiment, is made substantially of glass, and has, amongst other components, the drive transistor 14 formed on (or over) a first portion 46 thereof and the OLED 16 formed on (or over) a second portion 48 thereof.

In constructing the pixel 10, a gate metal layer 50 is first formed (e.g., deposited, patterned, and etched) on the first portion 46 of the substrate. The gate metal layer 50 may, for example, be made of aluminum and have a thickness of between 0.05 and 1 micrometers (μm). A gate dielectric film 52 is then formed partially over the gate metal layer 50, and may, for example, be made of silicon nitride and have a thickness of between 0.1 and 1 μm. A channel layer 54 is then formed over the gate dielectric film 52. The channel layer 54 is, in one embodiment, made of amorphous silicon (a-Si), and may have a thickness of between 0.05 and 1 μm.

An intermetal dielectric layer 56 is then formed over exposed portions of the gate metal layer 50, the channel layer 54, and the second portion 48 of the substrate 44. The intermetal dielectric layer 56 may be made of silicon nitride and have a thickness of between 0.1 and 2 μm. As shown in FIG. 2, the intermetal dielectric layer 56 is selectively etched to expose respective source and drain portions 58 and 60 of the channel layer 54. Although not specifically shown, the intermetal dielectric layer 56 may also serve as a dielectric for the storage capacitor 18 (FIG. 1).

A metal layer is then deposited and etched to form a source electrode 62 (i.e., the source 34 of the drive transistor 14), a drain electrode 64 (i.e., the drain 36 of the drive transistor 14), and a power conductor 66 (i.e., the power supply bus line 24 ($V_{DD}$)). As shown, the source and drain electrodes 62 and 64 contact the exposed source 58 and drain 60 portions of the channel layer 54. The metal layer used to form the source electrode 62, the drain electrode 64, and the power conductor 66 may, for example, be made of aluminum and have a thickness of between 0.2 and 2 μm. The formation of the source and drain electrodes 62 and 64 may substantially complete the formation of the drive transistor 14.

An insulating (or passivation) layer 68 is then formed over the drive transistor 14 and the second portion of the substrate 44. The insulating layer 68 may be, for example, made of silicon dioxide and have a thickness of between 0.5 and 5 μm. As shown, the insulating layer 68 is selectively etched to form an opening therethrough and expose a drain contact portion 70 of the drain electrode 64 and power contact portion 72 of the power conductor 66. Also created from the insulating layer 68 is an insulating body 74 over the second portion 48 of the substrate 44, and which partially overlaps the drain electrode 64.

A reflective layer (or reflector) 76 is then formed on the insulating body 74. The reflective layer 76 may be, for example, made of aluminum, an aluminum alloy, or a similar high reflectance material and have a thickness of between 0.1 and 1 μm. A microcavity (or μ-cavity) dielectric layer 78 is then deposited and etched such that one portion thereof is positioned over the second portion 48 of the substrate 44 and another portion thereof is positioned over the drive transistor 14. Examples of materials that may be used in the microcavity dielectric layer 78 include, for example, silicon nitride, silicon dioxide, and zirconium oxide ($ZrO_2$). The thickness of the microcavity dielectric layer 78 is tuned for each of the respective red, green, and blue OLED pixels to achieve efficient red, green, and blue pixel emissions in the display. As shown, the microcavity dielectric layer 78 may be etched such that the power contact portion 72 of the power conductor 66 remains exposed.

An anode electrode 80 (e.g., the anode 40 of the OLED 16) is then formed over the microcavity dielectric layer 78 and onto the power contact portion 72 of the power conductor 66. In one embodiment, the anode electrode 80 is made of indium tin oxide (ITO) and may have a thickness of between 0.05 and 2 µm. It should be noted that other anode electrodes may be formed simultaneously, such as anode electrode 82 formed over the drive transistor 14. It should also be noted that the formation of the anode electrode 80 may take place prior to the formation (or exposing) of the drain contact portion 70. It should be noted that the anode electrode 80 does not extend to the drain contact portion 70 of the drain electrode 64 and is separated and electrically insulated from the drain electrode 64 by the insulating layer 68, and in particular, the insulating body 74.

Figure 3:
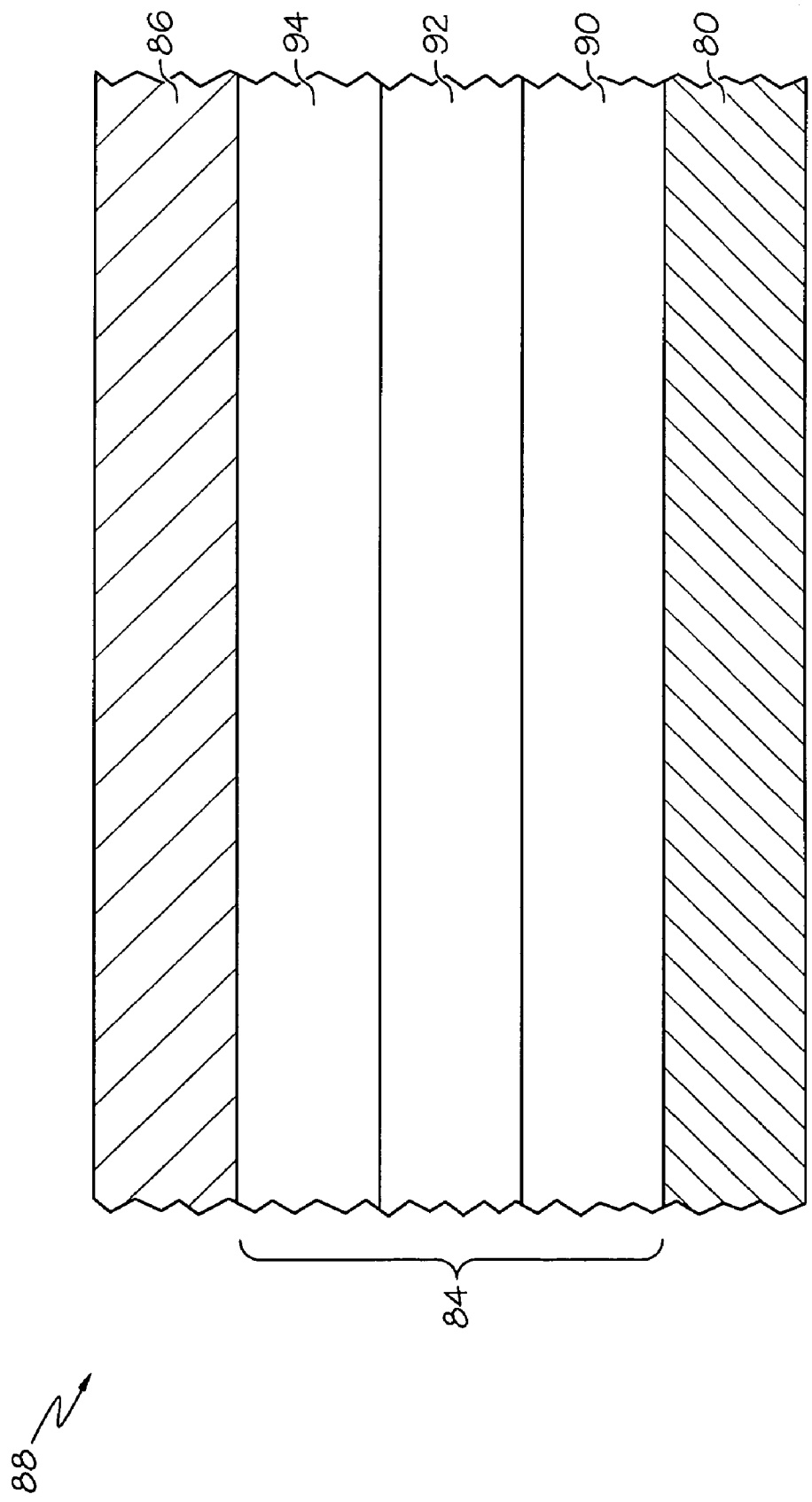
FIG. 3 is a cross-sectional side view of an OLED stack formed on the substrate of FIG. 2.

One or more organic layers 84 are then deposited over the anode electrode 80, followed by a cathode electrode layer (or cathode electrode) 86, to form an OLED stack 88. FIG. 3 illustrates the OLED stack 88, according to one embodiment of the present invention. The OLED stack 88 includes the anode electrode 80, the organic layers 84, and the cathode electrode 86. In one embodiment, the organic layers 84 include three sub-layers: a hole-transport layer (HTL) 90, an emissive layer (EML) 92, and an electron-transport layer (ETL) 94, as are commonly understood. The HTL 90 is formed on the anode electrode 80, the EML 92 is formed on the HTL 90, and the ETL 94 is formed on the EML 92. The organic layers 84 may include, for example, polymer OLED layers (or structures) or small molecule OLED layers and be formed using an ink-jet printing process or a "shadow mask" process and may be selectively varied such that the OLED 16 generates a particular color (e.g., red, green, or blue) when a potential is applied across the anode electrode 80 and the cathode electrode 86. It should be noted that the organic layers 84 (or a different set of organic layers) may also be formed over anode electrode 82. It should be noted that the OLED stack 88 may incorporate additional organic layers such as an electron blocking layer (EBL) or a hole blocking layer (HBL) to achieve efficient intrinsic OLED device operation.

Referring again to FIG. 2, the cathode electrode 86 is formed over the organic layer 84. Of particular interest is that the cathode electrode 86 contacts the drain electrode 64 of the drive transistor 14 at the drain contact portion 70 of the drain electrode 64. As is commonly understood, the cathode electrode 86 may be at least partially transparent (e.g., semi-transparent). The semi-transparent cathode electrode 86 may be made of multiple layers, such as lithium fluoride (LiF) (e.g. 0.5 nanometers (nm) thick), aluminum (e.g. 1 nm thick) formed over the lithium fluoride, and silver (e.g. 20 nm thick) formed over the aluminum, or a combination thereof. The formation of the cathode electrode 86 may substantially complete the formation of the top emitting OLED 16.

Additionally, the cathode electrode 86 may extend over the first portion 46 of the substrate 44, and in particular, any organic layers 84 that may be formed over the drive transistor 14, and the other pixel addressing circuitry such as the scan transistor 12. As such, as shown in FIG. 2 an additional OLED 91 region may be formed over the drive transistor 14 by the portions of the reflective layer 76, the organic layers 84, and the cathode electrode 86 thereover combined with anode electrode 82. The particular organic layers 84 within OLED 91 will be the same as those used in OLED 16 such that the light generated by OLED 91 is of the same frequency (i.e., color) from that generated by OLED 16. The OLED layers used in the adjacent pixel regions (not shown in FIG. 2) may have different colors (i.e., different OLED emissive layer) to achieve a full color display. Although not specifically shown, an additional transparent substrate (e.g., glass) may then be laminated over the drive transistor 14 and the OLEDS 16 and 91 to substantially complete an AM OLED display in accordance with one aspect of the present invention.

Figure 4:
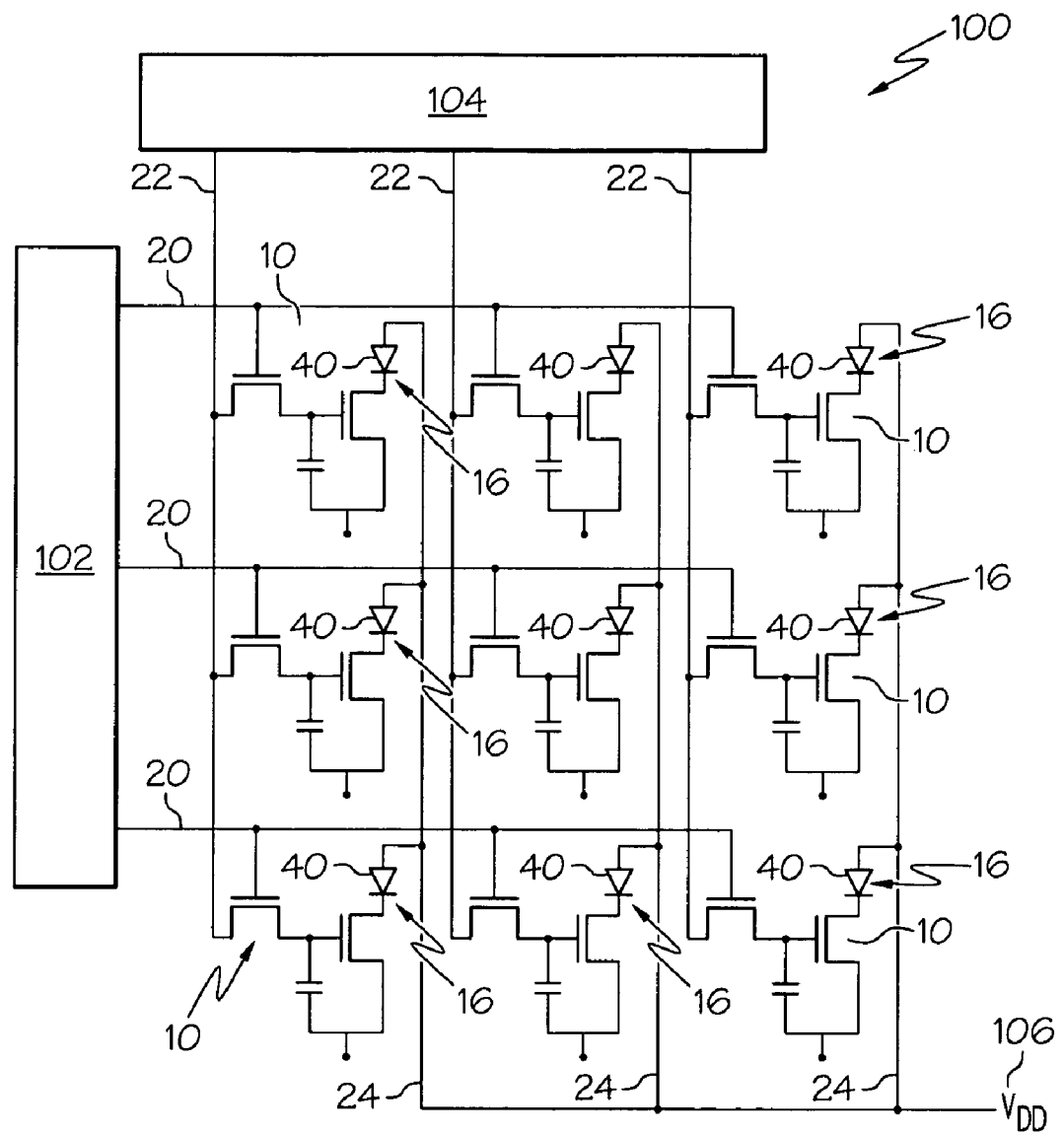
FIG. 4 is a schematic view of an AM OLED display system, according to one embodiment of the present invention.

FIG. 4 schematically illustrates an AM OLED display system (or device) 100, according to one embodiment of the present invention. The system 100 includes an array of pixels 10 (e.g., nine pixels) formed on a substrate (e.g., similar to the pixel 10 described above), a gate driver circuit 102, a data driver circuit 104, and a power supply 106 ($V_{DD}$). The gate driver circuit 102 and the data driver circuit 104 are electrically connected to the gate bus lines 20 and the data bus lines 22, respectively, and are configured to provide appropriate gate drive signals and input data signal voltages thereto to operate the pixels 10, as will be appreciated by one skilled in the art. The power supply bus lines 24 are electrically interconnected and connected to the power supply 106. As described above, within each pixel 10, the power supply bus line 24 is electrically connected to the anode 40 (and/or the anode electrode 80) of the OLED 16. As such, the anodes 40 (and/or the anode electrodes 80) jointly form a common, or global, anode.

One advantage is that the OLED device is fabricated on the drain side of the TFT with a common anode architecture. This ensures the source-drain voltage of the drive TFT is unaffected, and thus the TFT and the OLED drive current are unaffected, by any variations in the OLED device characteristics across the display. As a result, the luminance uniformity of the display is improved. Another advantage is that a top emission OLED with a common anode architecture is provided. In addition to increasing the pixel aperture ratio, this design allows for optimization of the transparent cathode for optimum light extraction without any significant constraints on the sheet resistance of the cathode, as in conventional top emission OLED designs, as well as optimization of color tuning of the different colors (e.g., red, green, and blue) of the pixels by tuning the microcavity OLED structure, which results in an improved color spectrum. Additionally, because the common anode electrode is connected to the global power bus ($V_{DD}$) in the active matrix array, the uniformity in anode potential is improved, without any voltage drops causing display uniformity issues. A further advantage is that the pixel storage capacitors are constructed using the respective gate electrode of the drive TFT and the source electrode of the drive TFT at the pixel. As a result, number of processing steps used to form the display, and thus the overall costs, are reduced.

Figure 5:
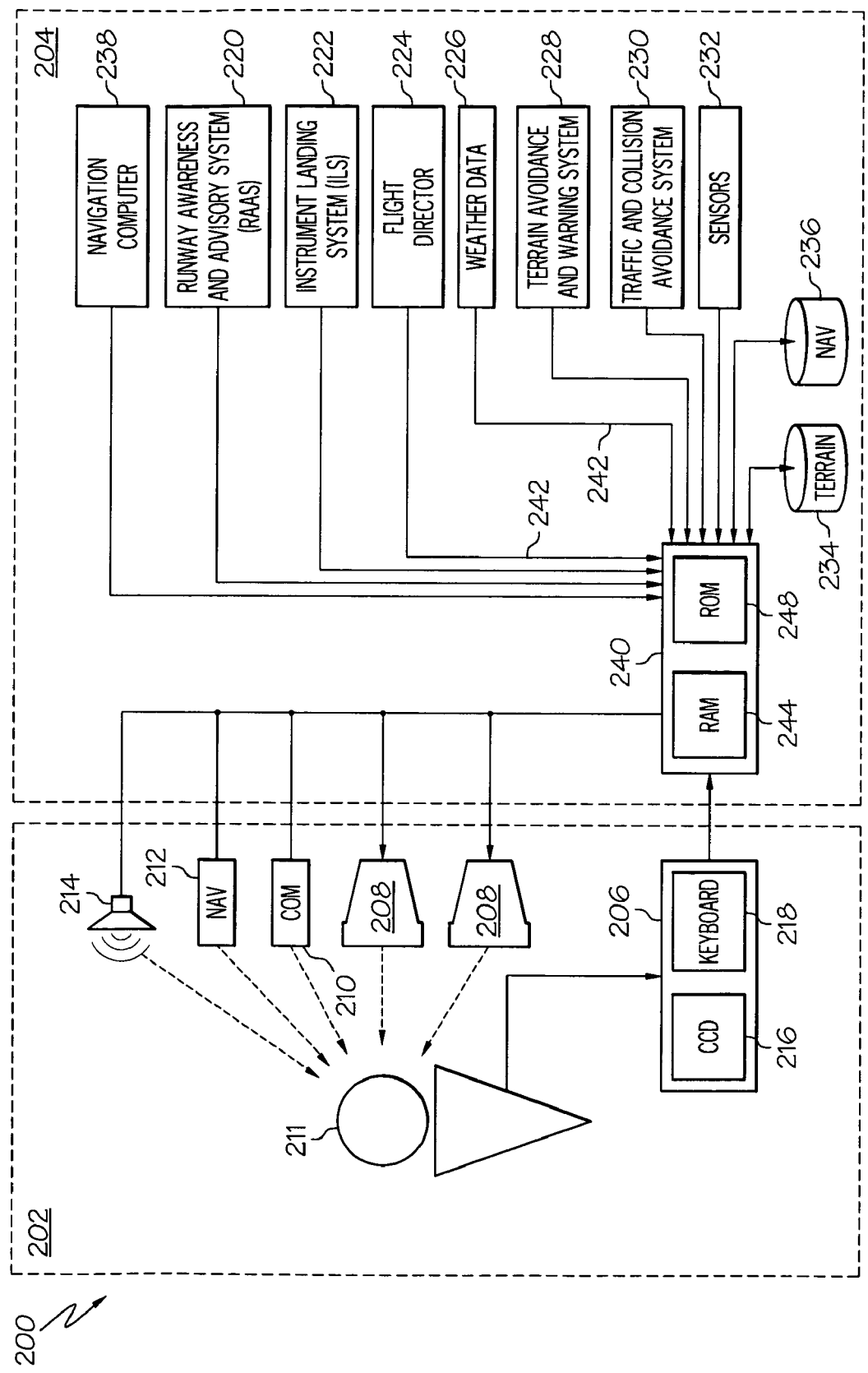
FIG. 5 is a schematic block diagram of a vehicle in which the display system of FIG. 1 may be implemented.

FIG. 5 schematically illustrates a vehicle 200, such as an aircraft, in which the display system 100 (FIG. 4) described above may be implemented, according to one embodiment of the present invention. The vehicle 200 may be, in one embodiment, any one of a number of different types of aircraft such as, for example, a private propeller or jet engine driven airplane, a commercial jet liner, or a helicopter. In the depicted embodiment, the vehicle 200 includes a flight deck 202 (or cockpit) and an avionics/flight system 204. Although not specifically illustrated, it should be understood that the vehicle 200 also includes a frame or body to which the flight deck 202 and the avionics/flight system 204 are connected, as is commonly understood. It should also be noted that vehicle 200 is merely exemplary and could be implemented without one or more of the depicted components, systems, and data sources. It will additionally be appreciated that the vehicle 200 could be implemented with one or more additional components, systems, or data sources. Additionally, is should be understood that the system 100 may be utilized in vehicles other than aircraft, such as manned ground vehicles with a closed cockpits (e.g. tank or armored personnel carrier) or an open vehicles such as a Humvee class vehicle. Further, the display system 100 may be used in portable computing devices such as laptop computers and other similar mobile devices with LCD displays.

The flight deck 202 includes a user interface 206, display devices 208 (e.g., a primary flight display (PFD)), a communications radio 210, a navigational radio 212, and an audio device 214. The user interface 206 is configured to receive input from the user 211 (e.g., the pilot) and, in response to the user input, supply command signals to the avionics/flight system 204. The user interface 206 may include flight controls and any one of, or combination of, various known user interface devices including, but not limited to, a cursor control device (CCD), such as a mouse, a trackball, or joystick, and/or a keyboard, one or more buttons, switches, or knobs. In the depicted embodiment, the user interface 206 includes a CCD 216 and a keyboard 218. The user 211 uses the CCD 216 to, among other things, move a cursor symbol on the display devices 208, and may use the keyboard 218 to, among other things, input textual data.

Still referring to FIG. 1, the display devices 208, which may include the flat panel display system described above, are used to display various images and data, in graphic, iconic, and/or textual formats, and to supply visual feedback to the user 211 in response to user input commands supplied by the user 211 to the user interface 206.

The communication radio 210 is used, as is commonly understood, to communicate with entities outside the vehicle 200, such as air-traffic controllers and pilots of other aircraft. The navigational radio 212 is used to receive from outside sources and communicate to the user various types of information regarding the location of the vehicle, such as Global Positioning Satellite (GPS) system and Automatic Direction Finder (ADF) (as described below). The audio device 214 is, in one embodiment, an audio speaker mounted within the flight deck 202.

The avionics/flight system 204 includes a runway awareness and advisory system (RAAS) 220, an instrument landing system (ILS) 222, a flight director 224, a weather data source 226, a terrain avoidance warning system (TAWS) 228, a traffic and collision avoidance system (TCAS) 230, a plurality of sensors 232 (e.g., a barometric pressure sensor, a thermometer, and a wind speed sensor), one or more terrain databases 234, one or more navigation databases 236, a navigation and control system (or navigation computer) 238, and a processor 240. The various components of the avionics/flight system 204 are in operable communication via a data bus 242 (or avionics bus). Although not illustrated, the navigation and control system 238 may include a flight management system (FMS), a control display unit (CDU), an autopilot or automated guidance system, multiple flight control surfaces (e.g., ailerons, elevators, and a rudder), an Air Data Computer (ADC), an altimeter, an Air Data System (ADS), a Global Positioning Satellite (GPS) system, an automatic direction finder (ADF), a compass, at least one engine, and gear (i.e., landing gear).

The processor, or processing system, 240 may be any one of numerous known general-purpose microprocessors or an application specific processor that operates in response to program instructions. In the depicted embodiment, the processor 240 includes on-board RAM (random access memory) 244 and on-board ROM (read only memory) 246. The program instructions that control the processor 240 may be stored in either or both the RAM 244 and the ROM 246. For example, the operating system software may be stored in the ROM 246, whereas various operating mode software routines and various operational parameters may be stored in the RAM 244. It will be appreciated that this is merely exemplary of one scheme for storing operating system software and software routines, and that various other storage schemes may be implemented. It will also be appreciated that the processor 240 may be implemented using various other circuits, not just a programmable processor. For example, digital logic circuits and analog signal processing circuits could also be used. Although not specifically shown, the processor 240 may also at least partially include the gate driver circuit 102 and the data driver circuit 104 (FIG. 4).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A pixel for an organic light emitting diode (OLED) display, the pixel comprising:
    a substrate;
    an n-channel transistor formed over the substrate, the n-channel transistor comprising a gate, a source, and a drain;
    an insulating layer formed over the transistor;
    a reflective layer formed on the insulating layer;
    a microcavity dielectric layer formed on the reflective layer;
    an anode layer formed on the microcavity dielectric layer;
    an OLED stack formed over the anode layer;
    a cathode layer formed on the OLED stack;
    wherein the cathode is electrically connected to the drain of the n-channel transistor through a via in the insulating layer, and the anode is electrically connected to a global power bus, and
    the global power bus is configured to be connected to a power supply outputting a voltage which is positive with respect to a ground.

2. The pixel for an OLED display of claim 1, further comprising an insulating body formed over the substrate, the insulating body insulating the anode of the OLED from the drain of the n-channel transistor.

3. The pixel for an OLED display of claim 2, wherein the microcavity dielectric layer has tuned thickness for red, green and blue color emissions from red, green and blue pixels of the OLED display.

4. The pixel for an OLED display of claim 1, wherein the transistor is a metal oxide semiconductor n-channel thin film transistor.

5. The pixel for an OLED display of claim 1, wherein the transistor is an amorphous silicon n-channel thin film transistor (TFT).

6. The pixel for an OLED display of claim 1, wherein the OLED stack further comprises a hole-transport layer, the emissive layer being formed over the over the hole-transport layer, and an electron-transport layer formed over the emissive layer.

7. The pixel for an OLED display of claim 6, wherein the anode of the OLED comprises indium tin oxide.

8. The pixel for an OLED display of claim 7, wherein the cathode of the OLED is semi-transparent and comprises lithium fluoride, aluminum, silver, or a combination thereof.

9. The pixel for an OLED display of claim 8, wherein the insulating body is an insulating layer formed over the n-channel TFT with an opening therethrough exposing a portion of the drain of the n-channel TFT.

10. The pixel for an OLED display of claim 9, wherein the cathode of the OLED contacts the exposed portion of the drain of the n-channel TFT.

11. A thin film transistor (TFT) organic light emitting diode (OLED) display device comprising:
at least one substrate;
a plurality of TFTs formed on the at least one substrate, each of the plurality of TFTs comprising a gate, a source, and a drain;
a plurality of reflector layers formed on the at least one substrate;
a plurality of microcavity dielectric layers formed on the at least one substrate; and
a plurality of OLEDs formed on the at least one substrate, each of the plurality of OLEDs comprising an anode, an emissive layer formed over the anode, and a semi-transparent cathode formed over the emissive layer,
wherein the anodes of the plurality of OLEDs are electrically interconnected to jointly form a common anode and the anode is electrically connected to a global power bus, and
the global power bus is configured to be connected to a power supply outputting a voltage which is positive with respect to a ground.

12. The TFT OLED display device of claim 11, wherein each of the plurality of microcavity dielectric layers has a tuned dielectric thickness for red, green or blue color emissions.

13. The TFT OLED display device of claim 12, wherein the cathode of each of the plurality of OLEDs is electrically connected to the drain of a respective one of the plurality of TFTs.

14. The TFT OLED display device of claim 13, further comprises a plurality of insulating bodies formed over the substrate, the plurality of insulating bodies insulating the anodes of the plurality of OLEDs from the drains of the respective transistors.

15. The TFT OLED display device of claim 14, wherein each of the plurality of OLEDs further comprises a hole-transport layer, the emissive layer of each OLED being formed over the over the hole-transport layer of the respective OLED, and an electron-transport layer formed over the emissive layer of the respective OLED.

16. A method for forming pixels of a thin film transistor (TFT) organic light emitting diode (OLED) display, the method comprising:
forming a plurality of n-channel TFTs on a substrate, each of the plurality of n-channel TFTs comprising a gate, a source, and a drain;
forming an insulating layer on the substrate and at least partially over the drains of at least some of the plurality of the n-channel TFTs;
forming a reflective layer formed on at least a portion of the insulating layer;
forming a microcavity dielectric layer on at least a portion of the reflective layer; and
forming a plurality of OLEDs on the substrate, the forming of each of the plurality of OLEDs comprising:
forming an anode over the insulating layer such that the anode is insulated from the drain of a respective one of the plurality of n-channel TFTs;
forming an emissive layer over the anode; and
forming a semi-transparent cathode over the emissive layer,
wherein the anodes of the plurality of OLEDs are electrically interconnected to jointly form a common anode.

17. The method of claim 16, wherein the forming of the insulating layer further comprises removing a portion of the insulating layer to expose a portion of the drain of the TFT.

18. The method of claim 17, wherein the forming of the cathode comprises forming a layer of conductive material over the emissive layer of the OLED and the exposed portion of the drain such that the cathode is electrically connected to the drain of the respective n-channel TFT.

19. The method of claim 18, wherein the OLED is formed over the reflective layer.

20. The method of claim 19, wherein the forming of the OLED further comprises:
forming a hole-transport layer over the reflective layer; and
forming an electron-transport layer over the emissive layer before the forming of the cathode.

* * * * *